United States Patent
Chang et al.

(10) Patent No.: US 10,541,204 B2
(45) Date of Patent: Jan. 21, 2020

(54) INTERCONNECTION STRUCTURE AND METHOD OF FORMING THE SAME

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/983,412

(22) Filed: Dec. 29, 2015

(65) Prior Publication Data

US 2017/0110398 A1 Apr. 20, 2017

Related U.S. Application Data

(60) Provisional application No. 62/244,022, filed on Oct. 20, 2015.

(51) Int. Cl.
  *H01L 23/00* (2006.01)
  *H01L 23/528* (2006.01)
  (Continued)

(52) U.S. Cl.
  CPC ........ *H01L 23/528* (2013.01); *H01L 21/7682* (2013.01); *H01L 21/76802* (2013.01); *H01L 21/76805* (2013.01); *H01L 21/76807* (2013.01); *H01L 21/76831* (2013.01); *H01L 21/76832* (2013.01); *H01L 21/76877* (2013.01); *H01L 23/485* (2013.01); *H01L 23/5226* (2013.01); *H01L 2221/1042* (2013.01); *H01L 2225/06541* (2013.01)

(58) Field of Classification Search
  CPC ......... H01L 23/481; H01L 2225/06541; H01L 23/49827; H01L 23/5226; H01L 21/76831; H01L 21/76877; H01L 21/76805
  See application file for complete search history.

(56) References Cited

U.S. PATENT DOCUMENTS 6,875,694 B1 * 4/2005 Ngo ................. H01L 21/76834
                                                              257/E21.576
8,097,536 B2   1/2012 Schuehrer et al.
(Continued)

FOREIGN PATENT DOCUMENTS

CN    101609829 A    12/2009
CN    103117244 A    5/2013
(Continued)

*Primary Examiner* — Ngan V Ngo
(74) *Attorney, Agent, or Firm* — Maschoff Brennan

(57) ABSTRACT

An interconnection structure includes a non-insulator structure, a dielectric structure, and a conductive structure. The dielectric structure is present on the non-insulator structure. The dielectric structure has a trench opening and a via opening therein. The trench opening has a bottom surface and at least one recess in the bottom surface. The via opening is present between the trench opening and the non-insulator structure. The conductive structure is present in the trench opening and the via opening and electrically connected to the non-insulator structure. The conductive structure is at least separated from the bottom of the recess.

20 Claims, 5 Drawing Sheets

(51) Int. Cl.
*H01L 21/768* (2006.01)
*H01L 23/485* (2006.01)
*H01L 23/522* (2006.01)

(56) References Cited

U.S. PATENT DOCUMENTS

| | | | |
|---|---|---|---|
| 2001/0012684 A1* | 8/2001 | Hattori | H01L 21/31144 438/618 |
| 2002/0055243 A1 | 5/2002 | Lee | |
| 2002/0100984 A1* | 8/2002 | Oshima | H01L 21/76801 257/774 |
| 2002/0134963 A1 | 9/2002 | Peyne et al. | |
| 2004/0097013 A1 | 5/2004 | Lur et al. | |
| 2004/0192021 A1 | 9/2004 | Li | |
| 2005/0142862 A1* | 6/2005 | Chun | H01L 21/76807 438/639 |
| 2006/0030128 A1 | 2/2006 | Bu et al. | |
| 2006/0057835 A1 | 3/2006 | Anderson et al. | |
| 2006/0073695 A1 | 4/2006 | Filippi et al. | |
| 2007/0037385 A1 | 2/2007 | Huebinger et al. | |
| 2007/0126120 A1 | 6/2007 | Tsao et al. | |
| 2008/0026568 A1 | 1/2008 | Standaert et al. | |
| 2008/0179747 A1 | 7/2008 | Sakai et al. | |
| 2008/0293245 A1* | 11/2008 | Abe | H01L 21/2885 438/675 |
| 2009/0134517 A1 | 5/2009 | Usui et al. | |
| 2009/0197404 A1 | 8/2009 | Yang | |
| 2009/0309226 A1 | 12/2009 | Horak et al. | |
| 2010/0052178 A1* | 3/2010 | Meinhold | H01L 21/76834 257/773 |
| 2012/0112301 A1* | 5/2012 | Humpston | H01L 27/14636 257/433 |
| 2012/0306090 A1* | 12/2012 | Smith | H01L 27/11548 257/773 |
| 2013/0127055 A1* | 5/2013 | Chen | H01L 23/53238 257/751 |
| 2013/0270703 A1* | 10/2013 | Zierath | H01L 21/76877 257/751 |
| 2014/0077334 A1* | 3/2014 | Bao | H01L 23/5256 257/529 |
| 2014/0131880 A1 | 5/2014 | Clevenger et al. | |
| 2014/0264709 A1* | 9/2014 | Tsai | H01L 23/481 257/459 |
| 2014/0264830 A1* | 9/2014 | Teh | H01L 23/53238 257/737 |
| 2015/0044865 A1 | 2/2015 | Chen et al. | |
| 2015/0069619 A1* | 3/2015 | Chou | H01L 27/1464 257/774 |
| 2015/0126030 A1* | 5/2015 | Yang | H01L 21/76879 438/675 |
| 2015/0179612 A1* | 6/2015 | Tsai | H01L 24/80 257/773 |
| 2015/0179613 A1* | 6/2015 | Tsai | H01L 24/92 257/773 |
| 2015/0187701 A1* | 7/2015 | Tsai | H01L 24/92 257/621 |
| 2015/0214289 A1* | 7/2015 | Kim | H01L 21/311 438/387 |
| 2015/0214293 A1* | 7/2015 | Liao | H01L 28/75 257/532 |
| 2015/0235896 A1 | 8/2015 | Mieth et al. | |
| 2015/0249038 A1* | 9/2015 | Xu | H01L 23/53223 257/751 |
| 2015/0255340 A1* | 9/2015 | Duong | H01L 21/76883 257/751 |
| 2015/0262873 A1* | 9/2015 | Chu | H01L 23/5226 257/773 |
| 2015/0279891 A1* | 10/2015 | Chen | H01L 27/14636 257/459 |
| 2015/0339422 A1* | 11/2015 | Greco | G06F 17/5068 438/702 |
| 2015/0348874 A1* | 12/2015 | Tsai | H01L 23/481 257/774 |
| 2015/0357335 A1* | 12/2015 | Kunishima | H01L 27/10814 257/296 |
| 2016/0056196 A1* | 2/2016 | Li | H01L 27/14636 257/432 |
| 2016/0064438 A1* | 3/2016 | Huang | H01L 27/1462 257/432 |
| 2016/0079161 A1* | 3/2016 | Lin | H01L 23/5226 257/774 |
| 2016/0079522 A1* | 3/2016 | Yamamoto | H01L 45/06 257/4 |
| 2016/0104638 A1* | 4/2016 | Preusse | H01L 21/76874 257/751 |
| 2016/0163816 A1* | 6/2016 | Yu | H01L 29/6656 438/283 |
| 2016/0197082 A1* | 7/2016 | Park | H01L 27/10826 257/296 |
| 2016/0276271 A1* | 9/2016 | Chen | H01L 21/31138 |
| 2016/0351435 A1* | 12/2016 | Wakamatsu | H01L 21/764 |
| 2016/0351546 A1* | 12/2016 | Tsai | H01L 25/0657 |

FOREIGN PATENT DOCUMENTS

| | | |
|---|---|---|
| DE | 10 2008 054 068 A1 | 6/2010 |
| JP | 2009-302501 A | 12/2009 |
| KR | 20090045198 A | 5/2009 |
| KR | 20100089902 A | 8/2010 |
| TW | 1360181 B | 3/2012 |

* cited by examiner

INTERCONNECTION STRUCTURE AND METHOD OF FORMING THE SAME

PRIORITY CLAIM AND CROSS-REFERENCE

This application claims priority to U.S. Provisional Application Ser. No. 62/244,022, filed Oct. 20, 2015, which is herein incorporated by reference.

BACKGROUND

A dual damascene process is a technique for forming interconnections in semiconductor devices. As the feature sizes get smaller, the dual damascene process provides a more exact dimensional control over small geometries. Therefore, the dual damascene process is suited for ultra large scale integrated (ULSI) circuit technology where more and more devices are being packed into the same or smaller areas in a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
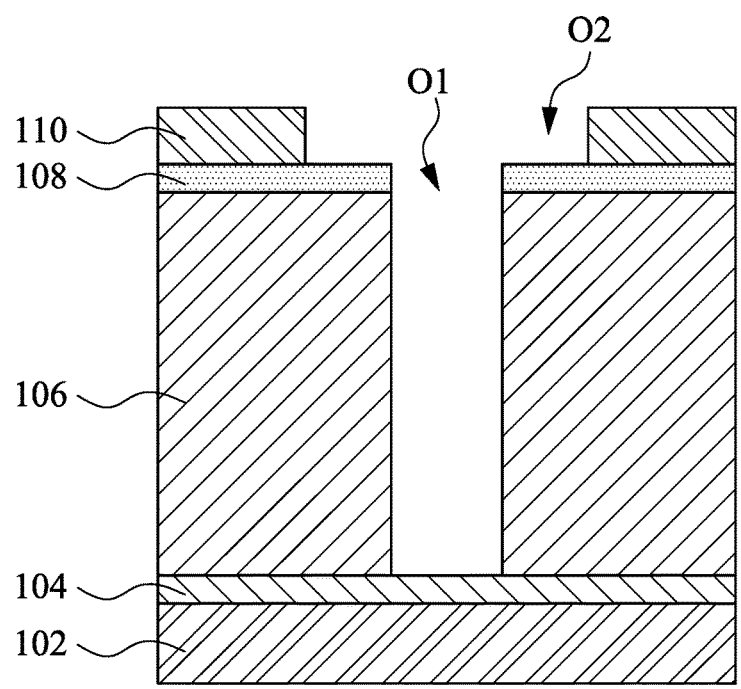
FIGS. 1 to 9 are cross-sectional views of a method for manufacturing an interconnection structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 9 are cross-sectional views of a method for manufacturing an interconnection structure at various stages in accordance with some embodiments of the present disclosure.

Reference is made to FIG. 1. A liner layer 104 is formed on a non-insulator structure 102. The non-insulator structure 102 refers to a structure formed of one or more non-insulator materials, polysilicon, metal, conductive materials, semiconductor materials or combinations thereof. The non-insulator structure 102 can serve as a gate electrode, a source/drain region of a semiconductor device, such as a fin field effect transistor (FinFET).

In some embodiments, when the non-insulator structure 102 serves as the gate electrode of the FinFET, the non-insulator structure 102 may be formed by a gate last process. An exemplary gate last process may include forming a dummy gate structure including a material, such as polysilicon, on a semiconductor fin, forming spacers including a material, such as silicon oxide, silicon nitride, silicon oxynitride, silicon carbide, beside the dummy gate structure, removing the dummy gate structure to form a trench between the spacers, and forming at least one metal layer into the trench between the spacers to from the non-insulator structure 102. The metal layer may include a metal material suitable for forming the gate electrode or a portion thereof, including, work function layers, liner layers, interface layers, seed layers, adhesion layers, barrier layers and so on. In some embodiments, the metal layer may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET.

In some embodiments, when the non-insulator structure 102 serves as the source/drain region, an exemplary formation process may include doping an n-type dopant, such as phosphorus, or a p-type dopant, such as boron, into at least one portion of the semiconductor fin not covered by the spacers and the gate electrode by using ion implantation. Another exemplary process of forming the source/drain region may include forming at least one source/drain recess in the fin adjacent to the spacer, forming a seed layer in the source/drain recess, forming a relaxed epitaxial layer on the seed layer in the source/drain recess, forming an epitaxial layer on the relaxed epitaxial layer in the source/drain recess, so that the seed layer, the relaxed epitaxial layer and the epitaxial layer form a source/drain stressor to serve as the source/drain region. In some embodiments, the source/drain stressor includes, for example, SiP, SiP or SiCP, which is able to induce a tensile strain to the n-type channel in the semiconductor fin. In some other embodiments, the source/drain stressor includes SiGe, which is able to induce a compressive strain to the p-type channel in the semiconductor fin.

The liner layer 104 may serve as an etch stop layer, which protects the non-insulator structure 102 during an etching process for forming a via opening and/or a trench opening. In some embodiments, the liner layer 104 may include a dielectric material, such as silicon carbide, silicon nitride or carbon-doped silicon nitride. In some embodiments, the liner layer 104 may include a conductive material, such as Ti, TiN, TiC, TiCN, Ta, TaN, TaC, TaCN, W, WN, WC, WCN, TiAl, TiAlN, TiAlC, or TiAlCN. In some embodiments, the liner layer 104 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. For example, in some embodiments, the MLD process is carried out under a pressure less than about 10 mTorr and in the temperature range from about 350° C. to about 500° C. In some embodiments, the silicon nitride is deposited on the top surface of the non-insulator structure 102 by reacting a silicon source compound and a nitrogen source. The silicon source compound provides silicon to the deposited silicon nitride and may include silane ($SiH_4$) or tetrathoxysilane (TEOS). The nitrogen source provides nitrogen to the deposited silicon nitride and may include ammonia ($NH_3$) or nitrogen gas ($N_2$). In some other embodiments, the carbon-doped silicon nitride is deposited on the top surface of the non-insulator structure 102 by reacting a carbon source compound, a silicon source compound, and a nitrogen source. The carbon source compound may include an organic compound, such as a hydrocarbon compound, e.g., ethylene ($C_2H_6$).

A dielectric structure 106 is formed on the liner layer 104 and the non-insulator structure 102. The dielectric structure 106 may be an interlayer dielectric (ILD) layer that includes a dielectric material. The dielectric material may include tetrathoxysilane (TEOS), a extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, and/or combinations thereof. The ELK dielectric material has a dielectric constant less than, for example, about 2.5. It is understood that the dielectric structure 106 may include one or more dielectric materials and/or one or more dielectric layers. In some embodiments, the dielectric structure 106 may be deposited on the liner layer 104 by CVD, HDP CVD, SACVD, spin-on, sputtering, or other suitable techniques.

An anti-reflection layer 108 is formed on the dielectric structure 106. The anti-reflection layer 108 may be formed of an organic material, an oxide material, a nitride material, or the like. The anti-reflection layer 108 may be formed by using suitable techniques, such as CVD.

An Etching process is performed to the anti-reflection layer 108 and the dielectric structure 106 to form a via opening O1 therein. For example, a photoresist layer (not shown) may be formed over the dielectric structure 106 and then patterned to form a photoresist mask with the image of the via opening O1. Using the photoresist layer as a mask, the pattern of the via opening O1 is then etched into the dielectric structure 106. After the etching process, the photoresist mask is removed by, for example, oxygen plasma ashing. The etching process of forming the via opening O1 is stopped by the liner layer 104, so that the via opening O1 is present on the liner layer 104 in this step. In other words, the liner layer 104 is exposed by the via opening O1. In some embodiments, the etching process may be a dry etching, wet etching and/or plasma etching process. The etching process of forming the via opening O1 may employ a mixture of tetrafluoromethane ($CF_4$), trifluoromethane ($CHF_3$) and oxygen as the etching gases.

A mask layer 110 is formed on the anti-reflection layer 108. The mask layer 110 has an opening O2 exposing a portion of the anti-reflection layer 108, so that an etching process can be performed to the exposed portion of the anti-reflection layer 108 and the underlying portion of the dielectric structure 106, so as to form a trench opening in a later step. In some embodiments, the mask layer 110 may be a hard mask, such as silicon nitride ($Si_3N_4$), which has relatively high etching resistivity compared to the anti-reflection layer 108 and the dielectric structure 106. Formation of the hard mask includes forming a hard mask layer on the anti-reflection layer 108 and then patterned to form the hard mask with the image of the opening O2. In some other embodiments, the mask layer 110 may be a photoresist layer. Formation of the mask layer 110 includes forming a photoresist layer on the anti-reflection layer 108 and then patterned to form a photoresist mask with the image of the opening O2.

Figure 2:
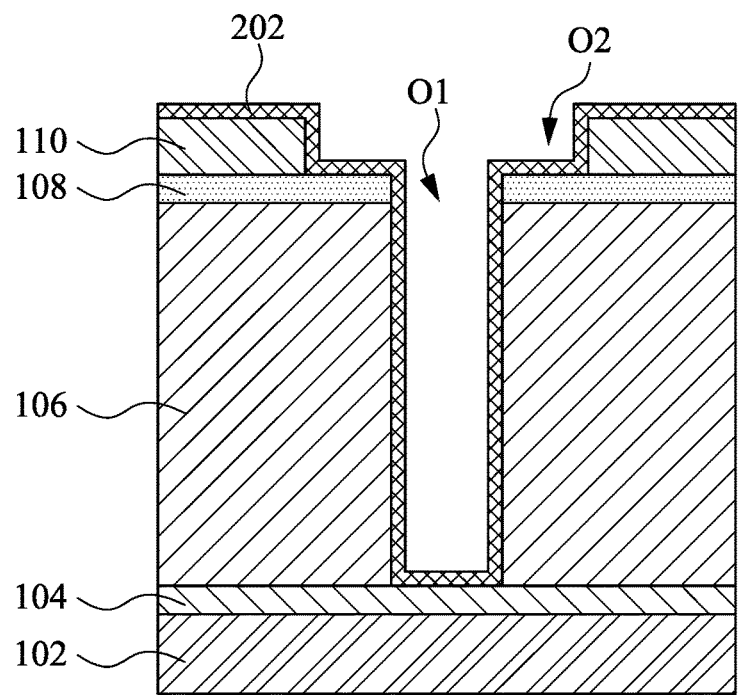

Reference is made to FIG. 2. A protective layer 202 is at least formed on the dielectric structure 106. In particular, the protective layer 202 is conformally formed on a top surface of the mask layer 110, a top surface of the anti-reflection layer 108, a top surface of the liner layer 104, an inner circumferential surface of the opening O2, and an inner circumferential surface of the via opening O1. In some embodiments, the protective layer 202 is at least partially on a portion of a top surface of the dielectric structure 106 where the trench opening is to be formed before the forming the trench opening. The protective layer 202 and the dielectric structure 106 have different etch properties. More particularly, the protective layer 202 may include a material having an etch selectivity different from an etch selectivity of the pre-etching dielectric structure 106. For example, the protective layer 202 may include a dielectric material, such as silicon nitride (SiN) or silicon oxynitride (SiON), and the dielectric structure 106 may include silicon oxide. "Etch selectivity" in this context is a ratio of an amount of an etch-target material etched away versus an amount of photoresist etched away in a single etching process. During a subsequent etching process of forming the trench opening, the etch selectivity of the protective layer 202 is lower than the etch selectivity of the dielectric structure 106, so that the protective layer 202 is not easier to be etched compared to the dielectric structure 106, and therefore, the protective layer 202 can prevent the underlying dielectric structure 106 from over-etched. Formation of the protective layer 202 may be performed by an atomic layer deposition (ALD) process or a CVD process. For example, the protective layer 202 may be a silicon nitride layer formed by ALD. The ALD for forming the silicon nitride layer includes multiple silicon nitride deposition cycles. Each silicon nitride deposition cycle may include contacting the surfaces of the mask layer 110, the anti-reflection layer 108, and the via opening O1 with a silicon precursor, such that the silicon precursor adsorbs on these surfaces, and contacting these surfaces with a nitrogen precursor. The silicon nitride deposition cycle may be repeated as many times as to achieve a desired thickness and composition of a silicon nitride layer is formed. This resulting silicon nitride layer serves as the protective layer 202.

Figure 3:
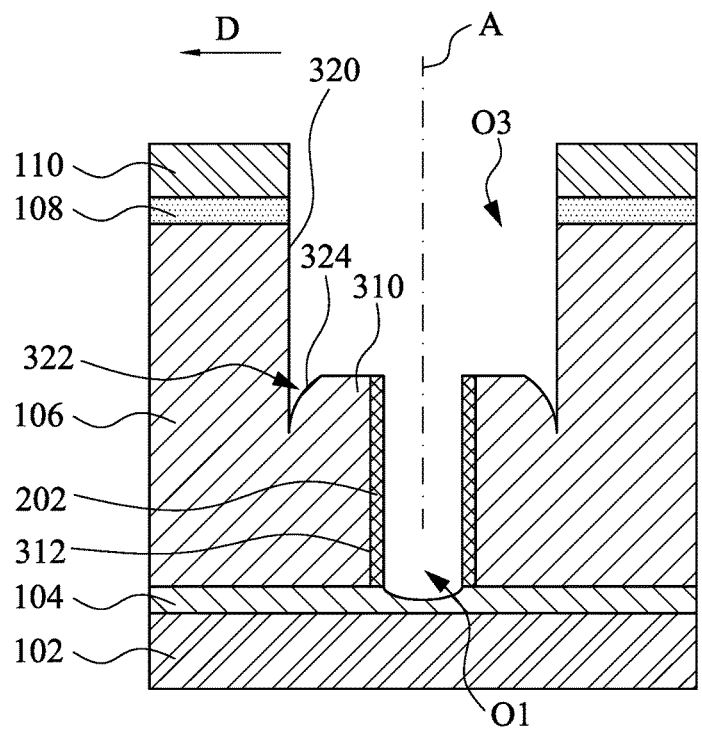

Reference is made to FIG. 3. Portions of the protective layer 202, the anti-reflection layer 108, and the dielectric structure 106 which are not covered by the mask layer 110 are removed to form a trench opening O3 in the dielectric structure 106. In other words, the dielectric structure 106 is recessed to form the trench opening O3. The removal process can be an etching process, such as an anisotropic etching process. The anisotropic etching process can be, for example, a $CF_4$ based or $C_4F_8$ based dry etching process. This removal process forms a via defining portion 310 under the trench opening O3. More particularly, at least one portion of the remaining dielectric structure 106 underlying the trench opening O3 serves as the via defining portion 310, which defines the via opening O1 between the trench opening O3 and the non-insulator structure 102. The trench opening O3 has a recess 322 and a bottom surface 324. The recess 322 is recessed in the bottom surface 324 due to the etching process of forming the trench opening O3. The depth of the recess 322 can be reduced by the sacrificed portion of protective layer 202 covering the removed portion of the dielectric structure 106 due to the difference of etch selectivity therebetween, so that the non-insulator structure 102 may be not etched or damaged due to the removal process of forming the trench opening O3. In some embodiments, the recess 322 is recessed into the via defining portion 310. In other words, a portion of the bottom surface 324 is located at a level lower than a top location of the via opening O1. Stated differently, a minimal distance from a lowest location of the bottom surface 324 to the non-insulator structure 102 is less than a minimal distance from the top location of the via opening O1 to the non-insulator structure 102. In some embodiments, the bottom surface 324 is uneven, and therefore, the via defining portion 310 is a thickness varying portion which has a spatially various thickness due to the removal process of forming the trench opening O3. In some embodiments, the trench opening O3 has a center axis A, and the thickness of the via defining portion 310 decreases along a direction D away from the center axis A of the trench opening O3. This thickness reduction is caused by the removal process of forming the trench opening O3, and the uneven bottom surface 324 is formed as well.

As shown in FIG. 3, the via defining portion 310 includes a sidewall 312 defining the via opening O1. In other words, the sidewall 312 is a circumferential wall surrounding the via opening O1. In some embodiments, after forming the trench opening O3, a portion of the protective layer 202 remains within the via opening O1 and on the sidewall 312. In a greater detail, the remaining portion of the protective layer 202 contacts with the sidewall 312.

Figure 4:
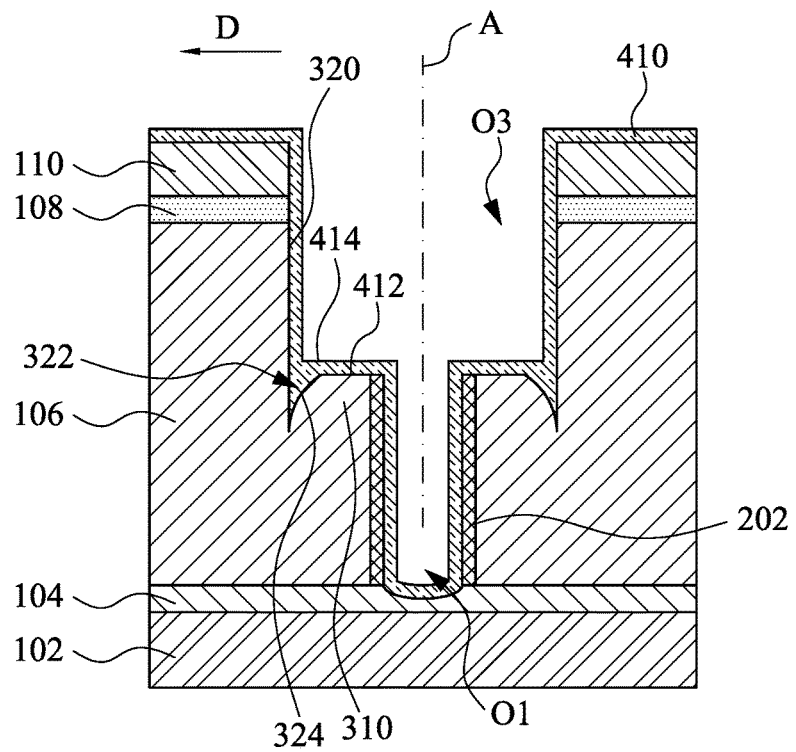

Reference is made to FIG. 4. Another protective layer 410 is at least formed on the bottom surface 324, which is able to fill the recess 322. In other words, the protective layer 410 is at least formed in the recess 322. As such, a conductive material filled in the trench opening O3, which is formed in a subsequent step as discussed in greater detail below, is separated from or spaced apart from a portion of the bottom surface 324 (or the bottom of the recess 322). This separation may prevent the conductive material filled in the trench opening O3 from contacting a portion of the bottom surface 324 (or the bottom of the recess 324), and therefore, the conductive material filled in the trench opening O3 is prevented from contacting the underlying non-insulator structure 102 when the trench formation process causes over-etching into the non-insulator structure 102. In other words, even if the recess 322 is formed into the non-insulator structure 102 in some cases, the conductive material in the trench opening O3 can be separated from the non-insulator structure 102. In some embodiments, the protective layer 410 is nonconductive, so that the protective layer 410 may not induce an undesirable electrical connection between the non-insulator structure 102 and the subsequently formed conductive material even if the recess 322 is formed into the non-insulator structure 102 in some cases.

In some embodiments, the trench opening O3 has a sidewall 320. The protective layer 410 is conformally formed on the bottom surface 324 and the sidewall 320 of the trench opening O3, inner circumferential surfaces of the mask layer 110, the anti-reflection layer 108 and the dielectric structure 106, a top surface of the mask layer 110, and an inner circumferential surface of the protective layer 202 within the via opening O1. In particular, the protective layer 410 has an inner surface 412 and an outer surface 414. The inner surface 412 and the outer surface 414 are opposite. The inner surface 412 is at least conformal to and contacted with the bottom surface 324, and therefore, the inner surface 412 is at least partially uneven as well, and the shape thereof corresponds with the shape of the bottom surface 324. The outer surface 414 is non-parallel to the inner surface 412, which may benefit the conductive material formed thereon in a subsequent step to have a surface overlying and non-parallel to the bottom surface 324. In some embodiments, a distance from an inner surface 412 to the outer surface 414 is spatially various, which benefits forming the non-parallel inner and outer surfaces 412 and 414. In some embodiments, the distance from an inner surface 412 to the outer surface 414 increases along a direction D away from the center axis A of the trench opening O3, which benefits the inner surface 412 conformal to the bottom surface 324 and benefits the outer surface 414 to be non-parallel to the inner surface 412. In some embodiments, a portion of the protective layer 410 overlying the via defining portion 310 has a spatially various thickness, which benefits forming the non-parallel inner and outer surfaces 412 and 414. In some embodiments, the portion of the protective layer 410 overlying the bottom surface 324 has the thickness increasing along the direction D away from the center axis A of the trench opening O3, which benefits the inner surface 412 conformal to the bottom surface 324 and benefits the outer surface 414 to be non-parallel to the inner surface 412.

The protective layer 410 and the dielectric structure 106 have different etch properties. In a greater detail, the protective layer 410 may include a material having an etch selectivity different from the etch selectivity of the dielectric structure 106. For example, the material of the protective layer 410 may be dielectric, such as silicon nitride (SiN) or silicon oxynitride (SiON), and the dielectric structure 106 may include silicon oxide. During a subsequent etching process of removing a portion of the liner layer 104 underlying the via opening O1, the etch selectivity of the protective layer 410 is lower than the etch selectivity of the dielectric structure 106, so that the protective layer 410 is not easier to be etched compared to the dielectric structure 106, and therefore, the protective layer 410 can prevent the underlying dielectric structure 106 from over-etched. Formation of the protective layer 410 may include an atomic layer deposition (ALD) process, or a CVD process. For example, the protective layer 410 may be a silicon nitride layer formed by ALD. The silicon nitride layer is formed by the ALD process including multiple silicon nitride deposition cycles, each silicon nitride deposition cycle may include contacting the bottom surface 324 and sidewall 320 of the trench opening O3, the top surface of the mask layer 110, a inner circumferential surface of the protective layer 202 within the via opening O1, and inner circumferential surfaces of the mask layer 110, the anti-reflection layer 108 and dielectric structure 106 with a silicon precursor, such that the silicon precursor adsorbs on these surfaces, and contacting these surfaces with a nitrogen precursor. The silicon nitride deposition cycle may be repeated as many times as to achieve a desired thickness and composition of a silicon nitride layer is formed. This resulting silicon nitride layer serves as the protective layer 410.

Figure 5:
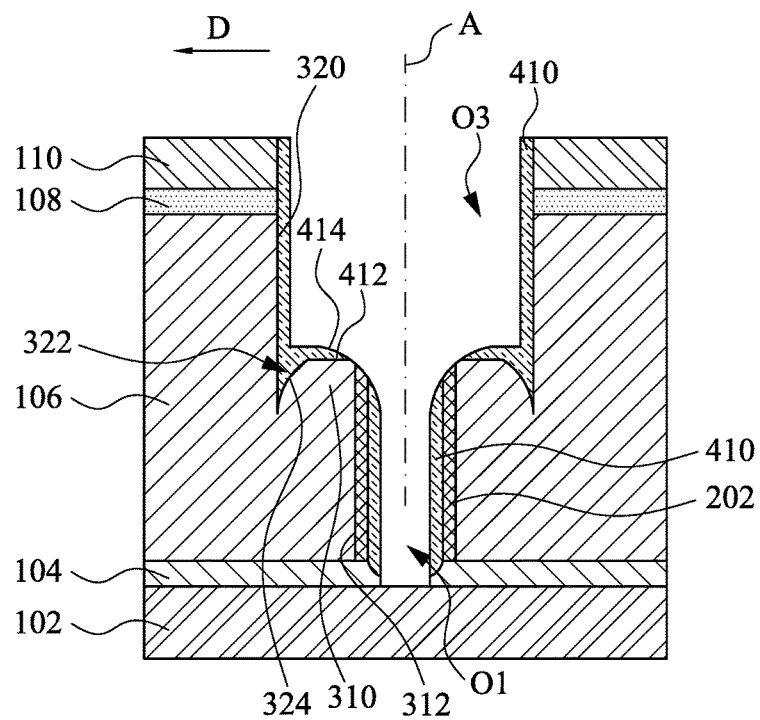

Reference is made to FIG. 5. A portion of the liner layer 104 underlying the via opening O1 is removed, which allows non-insulator structure 102 exposed by the via opening O1. For example, the portion of the liner layer 104 underlying the via opening O1 can be removed by using a dry etching process. The dry etching process may have a high selectivity such that the dry etching process may stop at the non-insulator structure 102. For example, the dry etching process may be performed under a source power of about 150 to 220 W, and a pressure of about 10 to 45 mTorr, using $CH_2F_2$ and Ar as etching gases. Unwanted etching of the non-insulator structure 102 may be reduced during the etching processes of forming the via and trench openings O1 and O3 due to the introduction of the liner layer 104 on the non-insulator structure 102. In a greater detail, the liner layer 104 may benefit forming a non-insulator structure 102 without a recess caused by the etching processes of forming the via and trench openings O1 and O3, thereby enhancing the device performance.

Since the liner etching process is performed after forming the protective layer 410, and the protective layer 410 and the dielectric structure 106 have different etch properties, the protective layer 410 can protect the underlying portion of the dielectric structure 106 (namely, the via defining portion 310) from over-etching during the liner etching process, and the recess 322 can be prevented from further forming into the non-insulator structure 102 during the liner etching process. In some embodiments, during the liner etching process, a portion of the protective layer 410 overlying the via defining portion 310 may be smoothed to form a round outer surface 414, and this round outer surface 414 is in the shape different from the inner surface 412 and the bottom surface 324. More particularly, in some embodiments, the round outer surface 414 may be convex toward the center axis A of the trench opening O3, while the inner surface 412 and the bottom surface 324 may be convex toward a direction away from the trench opening O3. In such a configuration, the distance from outer surface 414 to the inner surface 412 and/or the bottom surface 324 increases along the direction D away from the center axis A of the trench opening O3. In some embodiments, after the liner removal process, a portion of the protective layer 410 remains on the inner circumferential surfaces of the mask layer 110, the anti-reflection layer 108 and the dielectric structure 106, and a portion of the protective layer 410 remains on the protective layer 202 within the via opening O1. In other words, a portion of the protective layer 410 remained in the via opening O1 is surrounded by the protective layer 202 within the via opening O1. In such a resulting structure, the protective layers 202 is present between the protective layer 410 and the sidewall 312 of the via opening O1.

Figure 6:
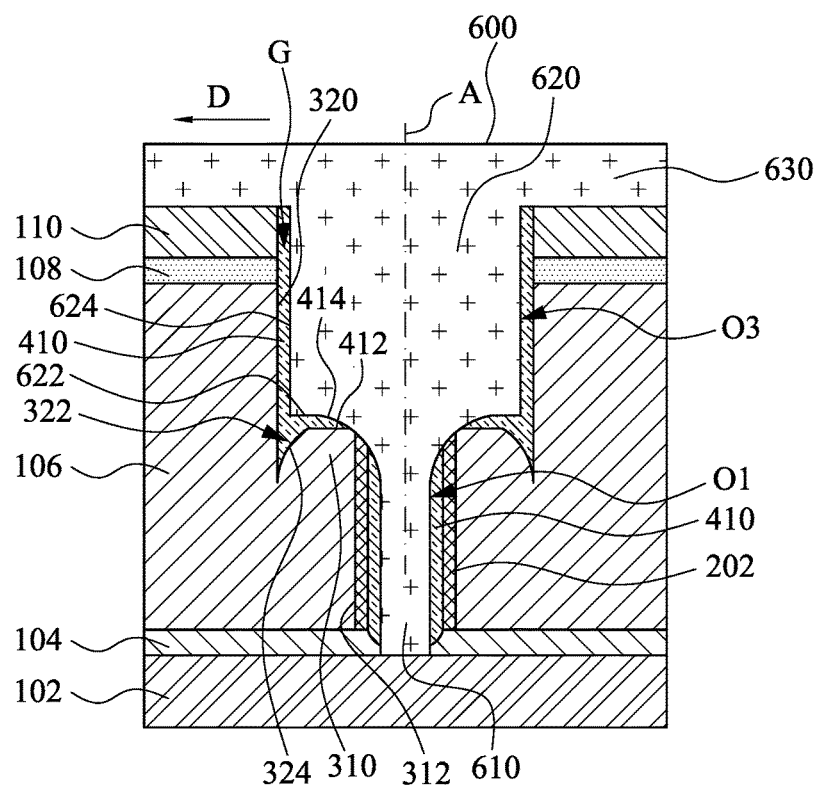

Reference is made to FIG. 6. A conductive structure 600 is formed in the via opening O1 and the trench opening O3 and on the protective layer 410. The conductive structure 600 is separated from or spaced apart from the bottom surface 324 and the sidewall 320 of the trench opening O3. In other words, the conductive structure 600 is located outside the recess 322 and separated from the bottom of the recess 322. More particularly, a portion of the protective layer 410 is present between the bottom surface 324 and the conductive structure 600, so as to space the conductive structure 600 and the bottom surface 324 apart. In some embodiments, the conductive structure 600 includes TiN, TaN, Ta, Ti, Hf, Zr, Ni, W, Co, Cu, or Al. In some embodiments, the conductive structure 600 may be formed by CVD, PVD, plating, ALD, or other suitable techniques. In some embodiments, the conductive structure 600 may include a laminate. The laminate may further include a barrier metal layer, a linear metal layer or a wetting metal layer. Further, the thickness of the conductive structure 600 is depend on the depth of the via and trench openings O1 and O3. The conductive structure 600 is deposited until the via and trench openings O1 and O3 are substantially filled or over-filled.

In some embodiments, when the conductive structure 600 over-fills the trench opening O3, the conductive structure 600 may include a lower conductive portion 610, a middle conductive portion 620 and an upper conductive portion 630. The middle conductive portion 620 connects the lower conductive portion 610 and the upper conductive portion 630. The lower conductive portion 610 fills the via opening O1. In a greater detail, the lower conductive portion 610 is present in the via opening O1 and surrounded by the protective layers 410 and 202. In other words, in some embodiments, the lower conductive portion 610, and the protective layers 410 and 202 within the via opening O1 may be arranged in a concentric manner. Stated differently, the protective layers 410 and 202 are present between the lower conductive portion 610 and the sidewall 312 of via opening O1. The overfilling portion of the conductive structure 600 forms the upper conductive portion 630 overlying the mask layer 110. The middle conductive portion 620 fills the trench opening O3. The middle conductive portion 620 includes a lower surface 622 toward the bottom surface 324. The lower surface 622 and the bottom surface 324 are separated by the protective layer 410. In such a configuration, the lower surface 622 of the middle conductive portion 620 is prevented from contacting the underlying non-insulator structure 102 even if the recess 322 is formed into the non-insulator structure 102 due to over-etching in some cases. In other words, even if the recess 322 is formed into the non-insulator structure 102 in some cases, the middle conductive portion 620 in the trench opening O3 can be located outside the recess 322 and therefore separated from the non-insulator structure 102 by the protective layer 410.

In some embodiments, the middle conductive portion 620 of the conductive structure 600 is conformally formed on the protective layer 410. In particular, the lower surface 622 of the middle conductive portion 620 is conformal to a portion of the outer surface 414 overlying the via defining portion 310. In other words, the lower surface 622 and the outer surface 414 have the same shape. Therefore, similar to the outer surface 414, in some embodiments, a distance from the lower surface 622 of the middle conductive portion 620 to the bottom surface 324 is spatially various. In other words, the lower surface 622 of the middle conductive portion 620 is non-parallel to the bottom surface 324. In some embodiments, the distance from the lower surface 622 of the middle conductive portion 620 to the bottom surface 324 increases along the direction D away from the center axis A of the trench opening O3.

In some embodiments, the middle conductive portion 620 includes a sidewall 624 opposite the sidewall 320 of trench opening O3. The sidewall 320 of the trench opening O3 and the sidewall 320 of the middle conductive portion 620 of the conductive structure 600 define a gap G therebetween. The gap G is filled with the protective layer 410. In some embodiments, the recess 322 is present between the gap G and the non-insulator structure 102. In some embodiments, the gap G is communicated with the recess 322, and both of them are filled with the protective layer 410.

Figure 7:
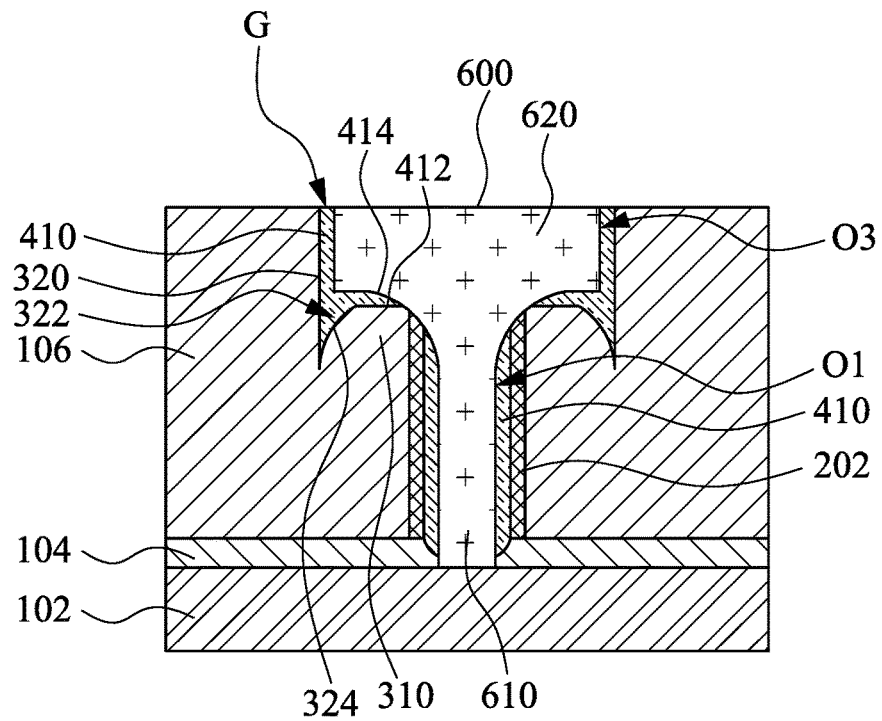

Reference is made to FIG. 7. A chemical-mechanical polishing (CMP) process is performed to planarize the conductive structure 600 after filling the via and trench openings O1 and O3. The CMP process removes the upper conductive portion 630 of the conductive structure 600 outside the via and trench openings O1 and O3, the CMP process may stop when reaching the dielectric structure 106, and thus providing a substantially planar surface. The CMP process removes the anti-reflection layer 108 and the mask layer 110.

Figure 8:
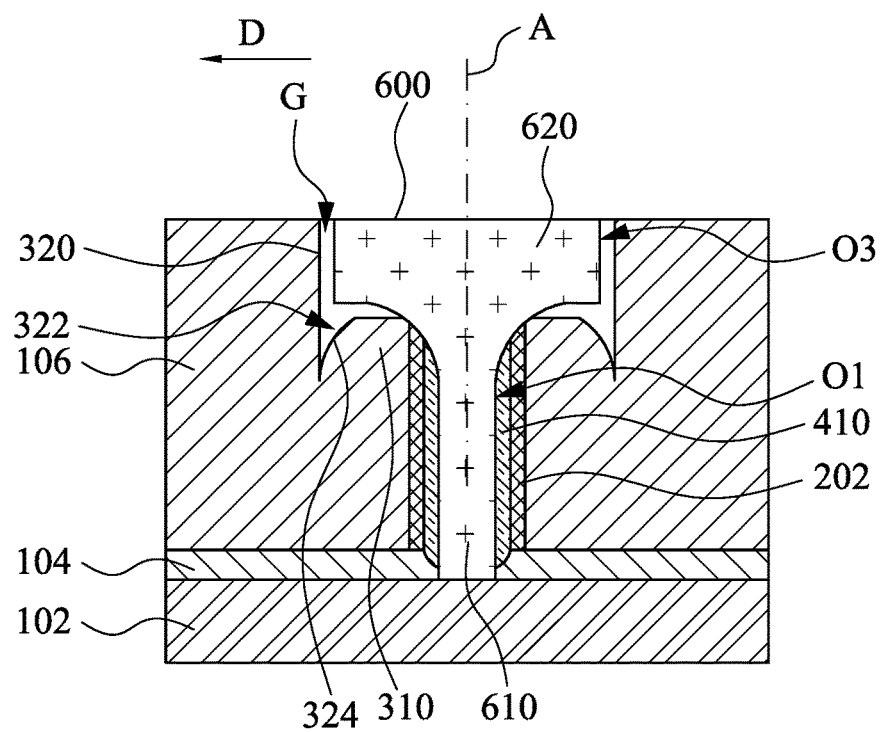

Reference is made to FIG. 8. A portion of the protective layer 410 in the trench opening O3 is removed to form a gas-containing space. In other words, after the removal process, the conductive structure 600 and the sidewall 320 and the bottom surface 324 of the trench opening O3 form a space therebetween, and the space is gas-containing or air-containing. In a greater detail, at least portions of the protective layer 410 in the gap G and in the recess 322 are removed to form a gas-containing space. In other words, the gap G and the recess 322 are communicated, and they are gas-containing or air-containing. In particular, after the removal process, the gas at least separates the conductive structure 600 from the bottom of the recess 322, and the gas at least separates the conductive structure 600 from the sidewall 320 of the trench opening O3 as well. The removal process includes a selective etching process which selectively removes the protective layer 410. For example, the protective layer 410 may be made of silicon nitride, and the conductive structure 600 and the dielectric structure 106 may be made of a material different from silicon nitride. The removal process includes selectively etching the silicon nitride layer between the conductive structure 600 and the dielectric structure 106, which may be performed by, for example, soaking the device in a hot phosphoric acid bath for a period of time.

In some embodiments, since the gas-containing recess 322 is formed by removing the portion of the protective layer 410 in the recess 322, this portion of the gas-containing recess 322 has a shape similar to the portion of the protective layer 410 in the recess 322 present in the former step. In a greater detail, the gas-containing recess 322 may have a spatially various thickness. In some embodiments, the thickness of the gas-containing recess 322 increases along a direction D away from a center axis A of trench opening O3. It is understood that formation of the gas-containing recess 322 and the gas-containing gap G is optional. In some other embodiments, a resulting interconnection structure may still include the protective layer 410 in the gap G and the recess 322 to space the conductive structure 600 and the dielectric structure 106 apart.

Figure 9:
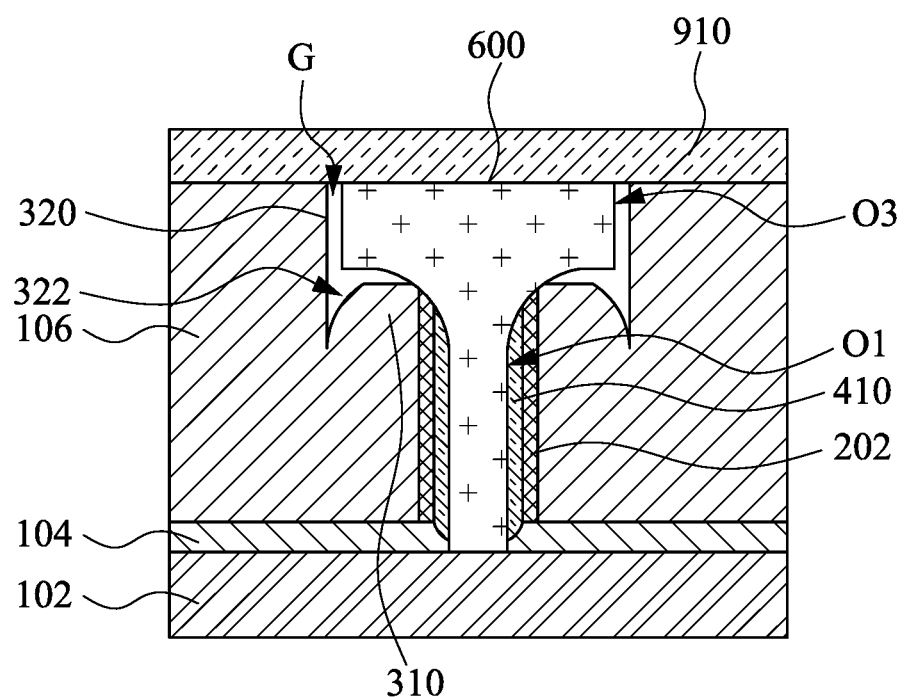

Reference is made to FIG. 9. In some embodiments, another stop layer 910 is formed on the conductive structure 600 and the dielectric structure 106. In some embodiments, the stop layer 910 may include a dielectric material, such as silicon carbide, silicon nitride or carbon-doped silicon nitride. In some embodiments, the stop layer 910 may be deposited on the conductive structure 600 and the dielectric structure 106 by using, such as CVD. In some embodiments, the silicon nitride is deposited by reacting a silicon source compound and a nitrogen source. The silicon source compound provides silicon to the deposited silicon nitride and may include silane ($SiH_4$) or tetrathoxysilane (TEOS). The nitrogen source provides nitrogen to the deposited silicon nitride and may include ammonia ($NH_3$) or nitrogen gas ($N_2$).

In some embodiments, since the protective layer is formed at least in the recess of the trench opening, the conductive structure formed in the trench opening can be at least separated from the bottom of the recess. As such, even if the recess is formed into the non-insulator structure due to over-etching in some cases, the conductive structure is prevented from formed into the non-insulator structure to induce an undesirable electrical connection.

According to some embodiments of the present disclosure, an interconnection structure includes a non-insulator structure, a dielectric structure, and a conductive structure. The dielectric structure is present on the non-insulator structure. The dielectric structure has a trench opening and a via opening therein. The trench opening has a bottom surface and at least one recess in the bottom surface. The via opening is present between the trench opening and the non-insulator structure. The conductive structure is present in the trench opening and the via opening and electrically connected to the non-insulator structure. The conductive structure is at least separated from the bottom of the recess.

According to some embodiments of the present disclosure, an interconnection structure includes a non-insulator structure, a dielectric structure, a conductive structure and at least one first dielectric protective layer. A dielectric structure is present on the non-insulator structure. The dielectric structure has a trench opening and a via opening therein. The via opening is present between the trench opening and the non-insulator structure. The conductive structure is present in the trench opening and the via opening and electrically connects the non-insulator structure. The first dielectric protective layer is present between the conductive structure and at least one sidewall of the via opening.

According to some embodiments of the present disclosure, a method of forming an interconnection structure includes forming a liner layer on a non-insulator structure, forming a dielectric structure on the liner layer, and forming at least one via opening in the dielectric structure, wherein a portion of the liner layer on the non-insulator structure is exposed by the via opening. At least one trench opening is formed in the dielectric structure, wherein the trench opening is communicated with the via opening. At least one first dielectric protective layer is at least partially formed on a bottom surface of the trench opening. The portion of the liner layer exposed by the via opening is removed to expose the non-insulator structure after the forming the first dielectric protective layer. A conductive structure is formed in the trench opening and the via opening, wherein the conductive structure is electrically connected to the exposed non-insulator structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure, comprising:
   a non-insulator structure;
   a dielectric structure present on the non-insulator structure, wherein the dielectric structure has a trench opening and a via opening therein, the trench opening has a bottom surface and at least one recess extending into the bottom surface to a position lower than a top of the via opening, and the via opening is present between the trench opening and the non-insulator structure;
   a conductive structure present in the trench opening and the via opening and electrically connected to the non-insulator structure, wherein the conductive structure is at least separated from a bottom of the recess; and
   a first protective layer between the conductive structure and the dielectric structure, wherein the first protective layer has a tapered top end.

2. The interconnection structure of claim 1, wherein the recess has gas therein, and the gas at least separates the conductive structure from the bottom of the recess.

3. The interconnection structure of claim 1, wherein the trench opening has at least one sidewall, a portion of the conductive structure in the trench opening has at least one sidewall opposite the sidewall of the trench opening, and the sidewall of the trench opening and the sidewall of the portion of the conductive structure define a gap therebetween.

4. The interconnection structure of the claim 3, wherein the recess is present between the gap and the non-insulator structure.

5. The interconnection structure of claim 3, wherein the gap is communicated with the recess.

6. The interconnection structure of claim 3, wherein the gap has gas therein, and the gas at least separates the conductive structure from the sidewall of the trench opening.

7. The interconnection structure of claim 1, wherein the first protective layer and the dielectric structure have different etch properties.

8. The interconnection structure of claim 1, further comprising:
at least one second protective layer present between the first protective layer and a sidewall of the via opening.

9. The interconnection structure of claim 1, further comprising:
at least one protective layer in the recess.

10. The interconnection structure of claim 9, wherein the protective layer is nonconductive.

11. An interconnection structure, comprising:
a non-insulator structure;
a dielectric structure present on the non-insulator structure, wherein the dielectric structure has a trench opening and a via opening therein, the via opening is present between the trench opening and the non-insulator structure, and the trench opening has a curved bottom surface;
a conductive structure present in the trench opening and the via opening and electrically connected to the non-insulator structure;
a first dielectric protective layer between the conductive structure and the dielectric structure; and
a second dielectric protective layer between the conductive structure and the first dielectric protective layer, wherein the second dielectric protective layer has a bottom end lower than a bottom end of the first dielectric protective layer.

12. The interconnection structure of claim 11, wherein the first dielectric protective layer and the dielectric structure have different etch properties.

13. The interconnection structure of claim 11, wherein the second dielectric protective layer and the dielectric structure have different etch properties.

14. The interconnection structure of claim 11, wherein an edge of the curved bottom surface is in a position lower than a top of the via opening.

15. An interconnection structure, comprising:
a non-insulator structure;
a dielectric structure on the non-insulator structure, the dielectric structure having a trench opening and a via opening therein, the trench opening having a curved surface;
a conductive structure present in the trench opening and the via opening and electrically connected to the non-insulator structure;
a spacing feature between a bottom edge of the curved surface and the conductive structure, wherein the spacing feature comprises a gas-containing space; and
a dielectric cap capping the spacing feature.

16. The interconnection structure of claim 15, wherein the spacing feature comprises a gas-containing space.

17. The interconnection structure of claim 15, wherein the spacing feature is separated from the non-insulator structure.

18. The interconnection structure of claim 1, wherein the tapered top end of the first protective layer is in contact with the conductive structure.

19. The interconnection structure of claim 11, wherein the bottom end of the second dielectric protective layer and the bottom end of the first dielectric protective layer have different shapes.

20. The interconnection structure of claim 11, wherein the bottom end of the second dielectric protective layer is tapered.

* * * * *